United States Patent
Taniguchi et al.

(10) Patent No.: US 6,824,884 B2
(45) Date of Patent: Nov. 30, 2004

(54) HEAT RESISTANT RESIN COMPOSITION, A HEAT RESISTANT FILM OR SHEET THEREOF AND A LAMINATE COMPRISING THE FILM OR THE SHEET AS A SUSBSTRATE

(75) Inventors: Kouichirou Taniguchi, Shiga (JP); Shingetsu Yamada, Shiga (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 10/343,959

(22) PCT Filed: Aug. 6, 2001

(86) PCT No.: PCT/JP01/06749

§ 371 (c)(1),
(2), (4) Date: Feb. 5, 2003

(87) PCT Pub. No.: WO02/14404

PCT Pub. Date: Feb. 21, 2002

(65) Prior Publication Data

US 2003/0186068 A1 Oct. 2, 2003

(30) Foreign Application Priority Data

Aug. 10, 2000 (JP) .................................... 2000-242614

(51) Int. Cl.[7] ........................... C08L 79/08; B32B 27/06
(52) U.S. Cl. .................... 428/473.5; 428/220; 525/436
(58) Field of Search ...................... 525/436; 428/473.5, 428/220

(56) References Cited

U.S. PATENT DOCUMENTS 6,228,467 B1    5/2001   Taniguchi et al. .......... 428/209

FOREIGN PATENT DOCUMENTS

| JP | 59-187054 | 10/1984 |
| JP | 2000-038464 | 2/2000 |
| JP | 2000-200950 | 7/2000 |
| WO | WO 85/01509 | 4/1985 |

OTHER PUBLICATIONS

"Binary Blends of Poly(ether ether ketone) and Poly (ether imide). Miscibility, Crystallization Behavior, and Semicrystalline Morphology" 6019, Macromolecules, 24(1991) Mar. 4, No. 5, Washington, D.C.

Primary Examiner—Ana Woodward
(74) Attorney, Agent, or Firm—Pitney Hardin LLP

(57) ABSTRACT

A heat resistant resin composition comprising 70 to 30 wt % of a crystalline polyarylketone resin having a peak crystalline melting temperature of 260° C. or higher and 30 to 70 wt % of a noncrystalline polyetherimide resin, wherein said composition has at least 2 peaks of loss tangent (tan δ) between 140° C. and 250° C., determined by dynamic mechanical measurement.

5 Claims, 2 Drawing Sheets

HEAT RESISTANT RESIN COMPOSITION, A HEAT RESISTANT FILM OR SHEET THEREOF AND A LAMINATE COMPRISING THE FILM OR THE SHEET AS A SUSBSTRATE

FIELD OF THE INVENTION

This invention relates to a heat resistant resin composition and a film or a sheet thereof and a laminate comprising the film or the sheet as a substrate.

DESCRIPTION OF THE PRIOR ART

A crystalline polyarylketone resin, typically polyetheretherketone, is excellent in heat resistance, flame retardant property, hydrolysis resistance, and chemical resistance, and, therefore, widely used mainly for aircraft parts, electric parts or electronic parts. However, raw materials for the polyarylketone resin are very expensive. Further, a glass transition temperature of the resin is so low as about 140° C. to 170° C. For this reason, various attempts have been, made to further improve heat resistance of the resin, among which a blend of the resin with a noncrystalline polyetherimide resin has attracted attentions. For instance, Japanese Patent Application Laid-open No. 59-187054/1984 and National Publication of PCT Application No. 61-500023/1986 disclose compositions of the crystalline polyarylketone resin with the noncrystalline polyetherimide resin; Japanese Patent Application Laid-open No. 59-115353/1984 describes that those compositions are useful for a substrate of a circuit board; Japanese Patent Application Laid-open No. 2000-38464 and Japanese Patent Application Laid-open No. 2000-200950 by the present inventors disclose a printed wiring board comprising the aforesaid composition and a production method thereof.

A flexible printed wiring board made of a film or sheet of the composition of the crystalline polyarylketone resin and the noncrystalline polyetherimide resin, which composition usually comprises an inorganic filler to improve dimensional stability, is good in dimensional stability and heat resistance. However, its mechanical strength, especially edge tearing resistance, is not satisfactory, which results in poor folding resistance or bending resistance. Therefore, reliable electrical connection is not secured, and the board has only limited applications. This problem needs to be solved. The aforesaid patent publications neither describe nor suggest causes or solutions of the problem.

Thus, an object of the present invention is to provide a heat resistant resin composition, a film or sheet thereof and a laminate comprising the film or sheet as a substrate, which are suitable for an electronic part such as a flexible printed wiring board.

SUMMARY OF THE INVENTION

The present inventors have found that the above problem can be solved by a resin composition which has a specific dynamic viscoelasticity and comprises a crystalline polyarylketone resin and a noncrystalline polyetherimide resin.

Thus, the present invention is a heat resistant resin composition comprising 70 to 30 wt % of a crystalline polyarylketone resin having a peak crystalline melting temperature of 260° C. or higher and 30 to 70 wt % of a noncrystalline polyetherimide resin, wherein said composition has at least 2 peaks of loss tangent (tanδ) between 140° C. and 250° C., determined by dynamic mechanical measurement. In a preferred embodiment, the crystalline polyarylketone resin is a polyetheretherketone resin having structural repeating units of the formula (1) and the noncrystalline polyethermide resin is a polyetherimide resin having structural repeating units of the formula (2).

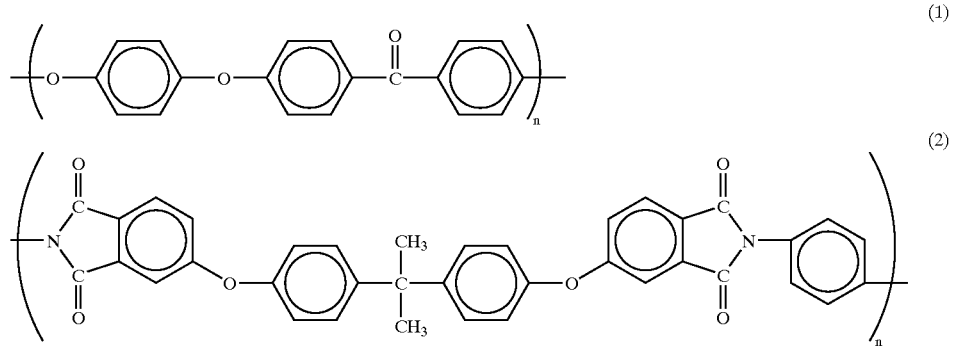

Further, the present invention is a heat resistant film or sheet composed of the aforesaid heat resistant resin composition.

Still further, the present invention is a laminate comprising at least one aforesaid heat resistant film or sheet and at least one conductive film bonded on at least one side of the heat resistant film or sheet by heat bonding without an intermediary adhesive layer. Preferably, the heat resistant film or sheet as a substrate of the laminate has a edge tearing resistance of 60N or larger both in a longitudinal direction and a transversal direction, determined according to the edge tearing resistance test specified in the Japanese Industrial Standard C2151.

DESCRIPTION OF THE PREFERRED EMBODIMENTS

The present invention will be explained in detail.

The present heat resistant resin composition comprises a crystalline polyarylketone resin and a noncrystalline polyetherimide resin. The crystalline polyarylketone resin used in the present invention is a thermoplastic resin having structural units which comprises aromatic nucleus bonds, ether bonds, and ketone bonds. Typical examples of the polyarylketone resin are polyether ketone, polyetheretherketone, and polyetherketoneketone, among which the polyetheretherketone of the following chemical formula (1) is preferably used in the present invention.

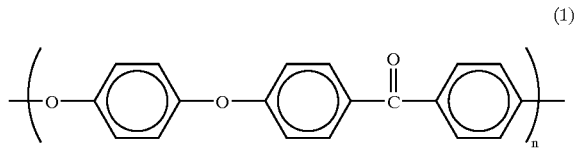

(1)

The noncrystalline polyetherimide resin is a thermoplastic resin having structural units which comprises aromatic nucleus bonds, ether bonds, and imide bonds. In the present invention, the polyetherimide of the following chemical formula (2) is preferably used.

No. 59-115353/1984, and U.S. Pat. No. 5,110,880 or described in literatures such as (a) J. E. Harris and L. M. Robeson, J.Appl.Polym.Sci, 35, 1877–1891(1988), (b) G. Crevecoeur and G. Groeninckx, Macromolecules, 24, 1190–1195(1990) and (c)Benjamin S. Hsiao and Bryan B. Sauer, J.Polym.Sci., Polym.Phys.Ed., 31, 901–915(1993). The polyarylketone is available under trade names, "PEEK151G", "PEEK381G", and "PEER450G", from VICTREX Co.

The aforesaid noncrystalline polyetherimide resin (3) is available under a trade name, "Ultem1000", from General Electric Co.

Surprisingly, the present inventors have found that no spherulite grows in crystallization treatment whereby edge tearing resistance is improved, if a polyetherimide resin of the chemical formula (2), available under a trade name, "Ultem CRS5001", from General Electric Co., is used instead of the aforesaid noncrystalline polyetherimide resin of the chemical formula (3), and thus attained the present invention. The reason for this is not clear, but is speculated that electronic interaction between molecules of the poly-

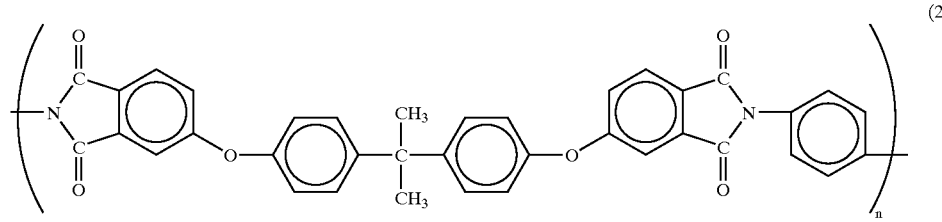

(2)

The present composition has at least 2 peaks of loss tangent (tan δ) between 140° C. and 250° C., determined by dynamic mechanical measurement, which is the most important feature.

Figure 1:
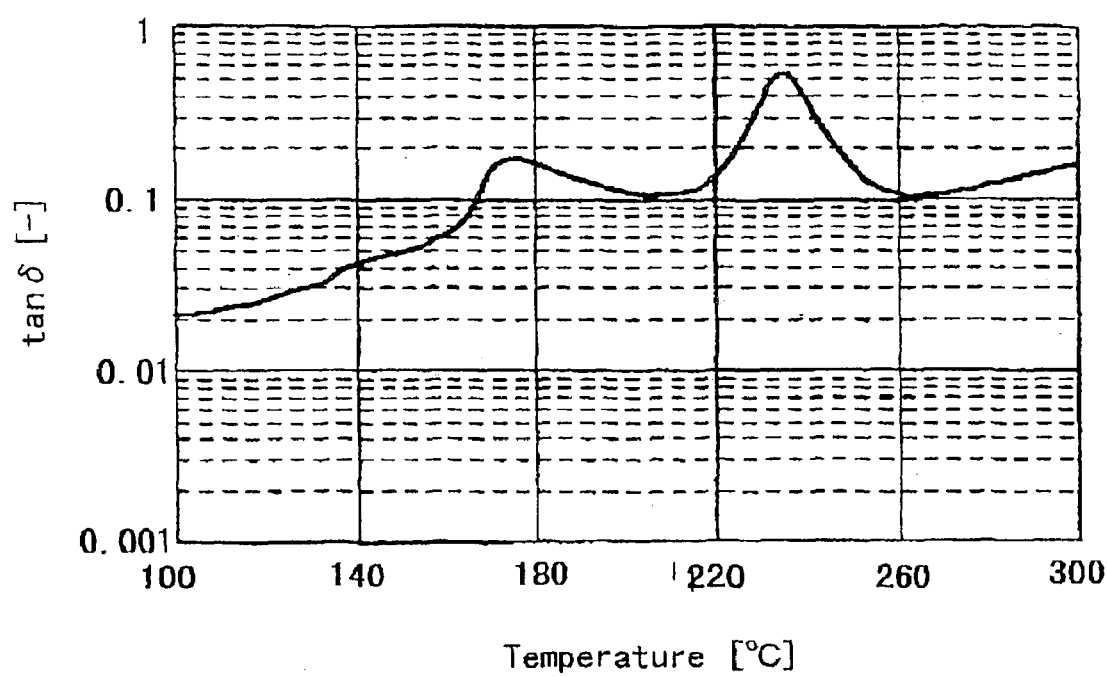
FIG. 1 is a conceptual diagram of loss tangent (tan δ) vs. temperature determined by dynamic mechanical measurement, and shows at least two peaks between 140° C. and 250° C.
Figure 2:
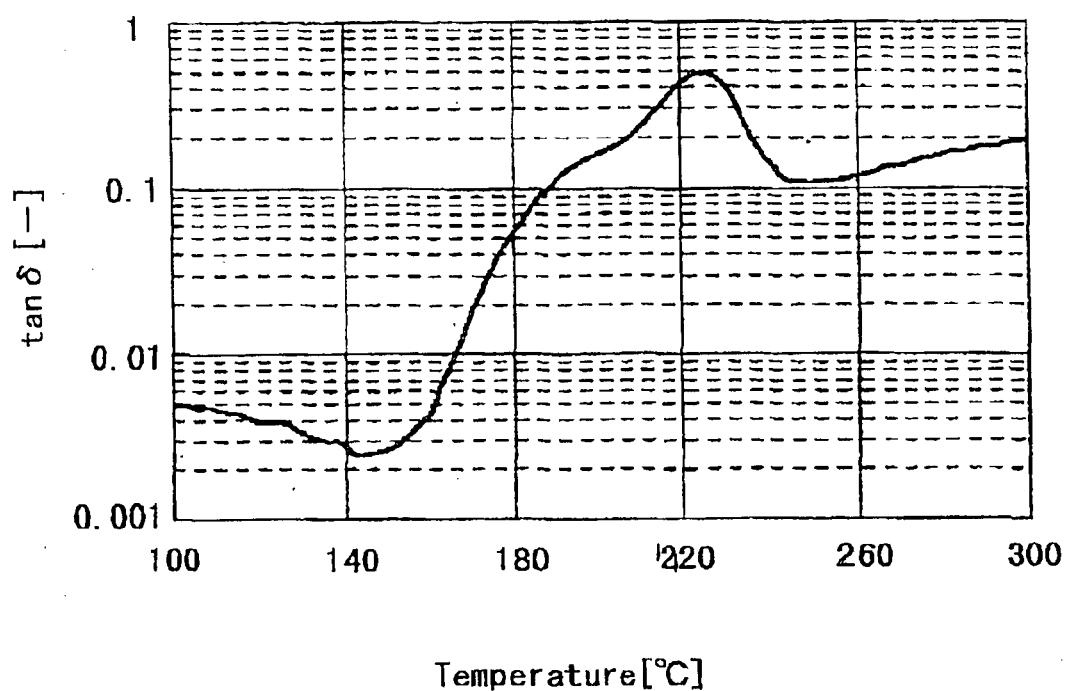
FIG. 2 is a conceptual diagram of loss tangent (tan δ) vs. temperature determined by dynamic mechanical measurement, and shows only one peak between 140° C. and 250° C.

As will be shown in the present Comparative Examples below, it has been found that, in a composition of a polyarylketone resin of the aforesaid chemical formula (1) with a noncrystalline polyetherimide resin of the following chemical formula (3), miscibility between the resins is so good that spherulites originating from the crystalline polyarylketone resin grow in crystallization treatment. The interfaces between the spherulites act as major defects to decrease mechanical strength, particularly edge tearing resistance. Here, the good miscibility can be confirmed by a fact that there is only one peak of loss tangent (tan δ) between 140° C. and 250° C., determined by dynamic mechanical measurement (see FIG. 2).

etheretherketone of the formula (1) and those of the polyetherimide resin of the formula (2) is different from that between the resin (1) and the polyetherimide resin of the formula (3), and miscibility is poorer, so that a unique high-order structure forms, which contributes to the improvement in edge tearing resistance. The poorer miscibility can be confirmed by a fact that at least two peaks of loss tangent (tan δ) are observed between 140° C. and 250° C., each peak originating from the crystalline polyarylketone resin component and the noncrystalline polyetherimide resin component, respectively (see FIG. 1)

If the peak temperature of the loss tangent (tan δ) is lower than 140° C., heat resistance of the composition tends to be insufficient. Generally, the polyarylketone resin has a peak temperature of the loss tangent (tan δ) not higher than about 170° C.; and the noncrystalline polyetherimide resin, not higher than about 250° C.

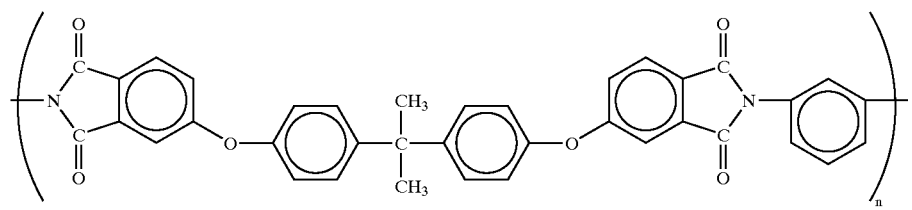

(3)

The aforesaid polyarylketone of the chemical formula (1) is used in Examples of patent publications such as Japanese Patent Application Laid-Open No. 59-187054/1984, National Publication of Translation of PCT Application No. 61-500023/1986, Japanese Patent Application Laid-Open A method of producing the noncrystalline polyetherimide resin is not limited to a particular one. Usually, the noncrystalline polyetherimide resin of the aforesaid formula (2) is produced by a known method as a polycondensation product of 4,4'-[isopropylidene bis(p-phenyleneoxy)diphthalic dianhydride with p-phenylenediamine; and the noncrystalline polyetherimide resin of the formula (3), as a polycondensation product of 4,4'-[isopropylidene bis(p-phenyleneoxy) diphthalic dianhydride with m-phenylenediamine. The aforesaid noncrystalline polyetherimide resin (2) may include other copolymerizable monomeric units in an amount which does not adversely affect the present invention.

In the present invention, the peak temperature of loss tangent (tan δ) is determined from data gathered by dynamic mechanical measurement using SOLIDS ANALYZER RSA-11, ex Rheometrics Co., at an oscillation frequency of 62.8 rad/sec and a heating rate of 1° C./min. The peak temperature of the loss tangent (tan δ) is a temperature where a first order derivative of the tan δ to temperature is zero. The peak temperature of the tan δ varies depending mainly on glass transition temperatures of the crystalline polyarylketone resin and the noncrystalline polyetherimide resin as well as their miscibility with each other (or mixing state). Besides at least two tan δ peaks, the present composition may have one or more tan δ peaks.

If the amount of the crystalline polyarylketone resin is more than 70 wt % or the amount of the noncrystalline polyetherimide resin is less than 30 wt %, an effect of raising a glass transition temperature of the whole composition is less, so that heat resistance tends to be undesirably low; crystal structure such as spherulites develops highly in crystallization treatment because of the high tendency to crystallize, so that edge tearing resistance tends to e undesirably low; and volume shrinkage (dimensional change) associated with the crystallization is larger, so that reliability of a circuit board tends to be poor. If the amount of the crystalline polyarylketone resin is less than 30 wt % or the amount of the noncrystalline polyetherimide resin is more than 70 wt %, a degree and rate of crystallization are so small that soldering heat resistance is undesirably low even when peak crystalline melting temperature is 260° C. or higher. Therefore, the composition preferably used in the present invention comprises 65 to 35 wt % of the aforesaid polyarylketone resin and 35 to 65 wt % of the noncrystalline polyetherimide resin. The present composition may comprise other resin or various additives such as inorganic fillers, heat stabilizers, UV absorbers, photo-stabilizers, nucleating agents, colorants, lubricants, and flame retardants in such an amount that does not adversely affect the properties of the composition. Particularly when the present composition is used for electronic parts such as a flexible printed wiring board, an inorganic filler is preferably incorporated in the composition to improve the dimensional stability of the parts. The inorganic filler is incorporated in an amount of from 10 to 40 parts by weight per 100 parts by weight of the composition comprising of the crystalline polyarylketone resin and the noncrystalline polyetherimide resin. If the amount is more than 40 parts by weight, the resultant film has undesirably low flexibility and low mechanical strength such as tear strength. If the amount is less than 10 parts by weight, decrease in an expansion coefficient is insufficient and, accordingly, improvement in th dimensional stability is insufficient.

Any known inorganic filler can be used, for example, talc, mica, clay, glass, alumina, silica, aluminum nitride, and silicon nitride, alone or in combination of two or more of them. Particularly preferred is one having an average particle size of from about 1 to about 20 μm and an average aspect ratio, i.e., a ratio of a particle diameter to thickness, of from about 20 to about 50, because a small amount of it, such as about 10 to 25 parts by weight, greatly improves the dimensional stability without decreasing mechanical strength.

To mix additives, any known method can be used. For example, (a) a master batch is prepared by incorporating the additive at a high concentration, typically of from 10 to 60 wt %, in an appropriate base resin, the polyarylketone resin and/or the noncrystalline polyetherimide resin, and added to the resins to be used to attain a desired concentration of the additive and then mechanically blended with a kneader or an extruder, or (b) the additive is mechanically blended directly with the resins to be used in a kneader or an extruder. Among the aforesaid mixing methods, the method (a), preparing a master batch and blending, is preferred because higher dispersion and easier handling of the additives is attained.

The present film or sheet, hereinafter simply referred to as film, may be formed by any known method such as an extrusion casting method using a T-die and a calendar method. Preferably, the extrusion casting method using a T-die is used, but not limited to it, because it allows one to make a film with ease and stable productivity. In the extrusion casting method using a T-die, a molding temperature is generally in a range of from about a melting temperature of the composition to about 430° C., though it is adjusted depending on a flow property and film moldability of the composition. The film usually has a thickness of from about 25 to about 300 μm. To improve handling property of the film, embossing or corona treatment may be applied to a surface of the film.

The present film can be suitably used for electronic parts such as a flexible printed wiring board. The board may be a monolayer (one side or both sides board) or a multilayer board, as long as it is provided with a conductive foil on at least one side.

The printed wiring board may be produced by a heat bonding method, where no adhesive layer is used. For instance, a hot press method, a thermolaminating roll method or a combination thereof may be preferably used. The conductive foil used may be a metal foil such as copper, gold, silver, aluminum, nickel, and tin, having a thickness of from 5 to 70 μm. Usually, the copper foil is used, particularly one chemically treated, e.g., by black oxidation treatment. To increase bonding strength to the film, a surface of the conductive foil to be bonded to the film is preferably roughened chemically or mechanically before bonding. An example of such a roughened conductive film is a roughened copper foil which has been electrochemically treated in the production of electrolytic copper foils.

On the conductive foil, conductive circuits may be formed by any known method such as a subtractive method, i.e., etching, an additive method, i.e., plating, a die stamping method, i.e., die molding, and a printing method of a conductive material such as conductive paste. In a multi-layer board, inter-layer connection may be realized by plating through-holes with copper, by filling through-holes or inner-via-holes with conductive paste or solder balls, or by using an anisotropic conductive material containing conductive fine particles as an insulating layer.

EXAMPLES

The present invention will be explained with reference to the following Examples, but not limited to them. Measurements and evaluation of the films described in the Examples were carried out as follows, wherein a longitudinal direction means a machine direction of an extruder and a transversal direction means a direction normal to the machine direction.
(1) Peak Temperature of Loss Tangent (tan δ)

The peak temperature of loss tangent (tan δ) was determined from dynamic mechanical data measured with SOL- IDS ANALYZER RSA-II, ex Rheometrics Co., at an oscillation frequency of 62.8 rad/sec and a heating rate of 1° C./min. Specimens used in the measurement were 75 μm thick films which were prepared with an extruder provided with a T-die and then heat treated for crystallization in a thermostatic oven at 220° C. for 120 minutes. The measurement was performed on the transversal direction of the films.

(2) Peak Melting Temperature of Crystal (Tm)

The peak crystalline melting temperature was determined from thermograms obtained according to Japanese Industrial Standards (JIS) K7121 on 10 mg of a sample at a heating rate of 10° C./min using DSC-7, ex Perkin-Elmer Co.

(3) Bonding Strength

The bonding strength was measured according to the method for measuring peeling strength of a film in its original state specified in JIS C6481.

(4) Soldering Heat Resistance

In accordance with JIS C6481 for the soldering heat resistance test of a film in its original state, a test specimen was floated on a solder bath at 260° C. for 10 seconds in such a manner that a copper foil laminated on the film was in contact with the solder. After cooled to room temperature, the specimen was visually observed for the presence of blistering and/or peeling and evaluated according to the criteria blow.

Good: No blistering or peeling observed.

Bad: Blistering and/or peeling observed.

(5) Edge Tearing Resistance

According to the edge tearing resistance test specified in JIS C2151, a test specimen of 15 mm width by 300 mm length was cut out from a 75 μm-thick film and tested both in its longitudinal and transversal directions at a drawing speed of 500 mm/min using a test fixture B.

Example 1

As shown in Table 1, a composition consisting of 50 wt % of a polyetheretherketone resin (PEEK381G, ex Victrex Co., having a Tm of 334° C. and a peak temperature of loss tangent (tan δ) of 166.4° C.), hereinafter simply referred to as PEEK, and 50 wt % of a noncrystalline polyetherimide resin (Ultem CRS5001, ex General Electric Co., having a peak temperature of loss tangent (tan δ) of 241.4° C.), hereinafter simply referred to as PEI-1, was extruded into a 75 u m-thick film in an extruder provided with a T-die at 380° C. The peak temperatures of loss tangent (tan δ) of the film obtained are as shown in Table 1.

Comparative Example 1

Example 1 was repeated except that a noncrystalline polyetherimide resin (Ultem 1000, ex General Electric Co., having a peak temperature of loss tangent (tan δ) of 232.4° C.), hereinafter simply referred to as PEI-2, was used instead of PEI-1 used in Example 1. The peak temperature of loss tangent (tan δ) of the film obtained is as shown in Table 1.

Example 2

As shown in Table 2 a composition consisting of 50 parts by weight of PEEK, 50 parts by weight of PEI-1 and 20 parts by weight of commercially available mica having an average particle size of 10 μm and an average aspect ratio of 30 was extruded into a 75 μm-thick film in an extruder provided with a T-die. The film was immediately laminated with a copper foil of a thickness of 18 μm with a roughened surface. A roll of the copper laminated film obtained of 100 m length was subjected to crystallization in a thermostatic oven at 220° C. for 120 minutes The results of the measurements and the evaluation performed on the copper laminated crystallized film thus obtained are as shown in Table 2.

Comparative Example 2

Example 2 was repeated except that PEI-2 was used instead of PEI-1. The results of measurements and the evaluation performed on the copper laminated crystallized film obtained are as shown in Table 2.

Comparative Example 3

Example 2 was repeated except that PEI-2 was used instead of PEI-1 and a mixing ratio of PEEK to PEI-2 was changed to 25/75. The results of measurements and the evaluation performed on the copper laminated crystallized film obtained are as shown in Table 2.

TABLE 1

|  | Example 1 | Comparative Example 1 |
|---|---|---|
| PEEK (wt %) | 50 | 50 |
| PEI-1 (wt %) | 50 |  |
| PEI-2 (wt %) |  | 50 |
| Peak Temperature of Loss Tangent (tan δ) (° C.) | 176 235 | 226 |

TABLE 2

|  | Example 2 | Comparative Example 2 | Comparative Example 3 |
|---|---|---|---|
| PEEK (parts by weight) | 50 | 50 | 25 |
| PEI-1 (parts by weight) | 50 |  |  |
| PEI-2 (parts by weight) |  | 50 | 75 |
| Mica (parts by weight) | 20 | 20 | 20 |
| Bonding Strenght (N/mm) | 1.6 | 1.5 | 1.6 |
| Soldering Heat Resistance | Good | Good | Bad |
| Edge Tearing Resistance (N) Longitudinal | 147.1 | 145.1 | 117.7 |
| Edge Tearing Resistance (N) Transversal | 112.6 | 53.9 | 39.2 |

It is evident from Tables 1 and 2 that the boards comprising the film made of the present resin composition having 2 peaks of loss tangent (tan δ) were excellent in the bonding strength to a copper foil and in the soldering heat resistance. Also the films in Examples 1 and 2 showed superior edge tearing resistance of 60 N or higher both in the longitudinal and the transversal directions and, particularly, the edge tearing resistance in the transversal direction was 2 or more times as much as that of the film in Comparative Example 2. On the other hand, the films in Comparative Examples 1 and 2 made of the resin composition having only one peak of loss tangent (tan δ) were inferior in the edge tearing resistance. The board in Comparative Example 3 comprising the film made of the composition comprising a less amount of the crystalline polyarylketone resin than the amount specified in the present invention showed insufficient soldering heat resistance.

INDUSTRIAL APPLICABILITY

The present invention provides a heat resistant resin composition a file or sheet thereof and a laminate comprising the film or sheet as a substrate, which are suitable for electronic parts such as an flexible printed wiring board.

What is claimed is:

1. A heat resistant resin composition comprising 70 to 30 wt % of a crystalline polyarylketone resin having a peak crystalline melting temperature of 260° C. or higher and 30 to 70 wt % of a noncrystalline polyetherimide resin, wherein said composition has at least 2 peaks of loss tangent (tan δ)

between 140° C. and 250° C. a peak temperature of tan δ of the polyetherimide resin not higher than 250° C., determined by dynamic mechanical measurement, and wherein a first order derivative of the tan δ to temperature of each of said 2 peaks changes from a positive to a negative value with an increase in temperature of said composition.

2. The heat resistant resin composition according to claim 1, wherein the crystalline polyarylketone resin is a polyetheretherketone resin having structural repeating units of the formula (1) and the noncrystalline polyetherimide resin is a polyetherimide resin having structural repeating units of the formula (2)

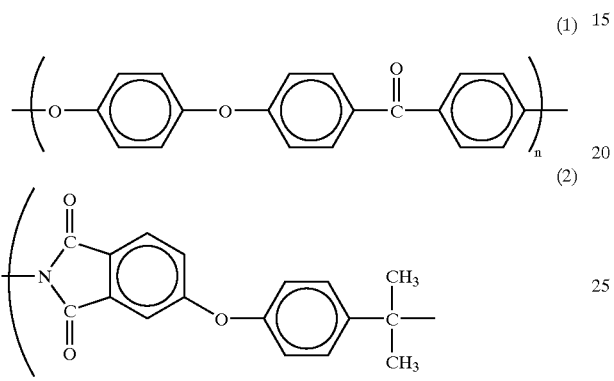

-continued

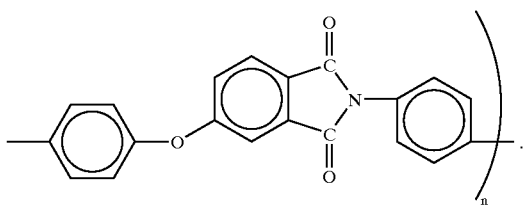

3. A heat resistant film or sheet composed of the heat resistant resin composition according to claim 1.

4. A laminate comprising at least one heat resistant film or sheet according to claim 3 and at least one conductive film bonded on at least one side of the heat resistant film or sheet by heat bonding without an intermediary adhesive layer.

5. The laminate according to claim 4, wherein the heat resistant film or sheet has a edge tearing resistance of 60N or larger both in a longitudinal direction and a transversal direction, determined according to the edge tearing resistance test specified in the Japanese Industrial Standard C2151.

* * * * *